(12) United States Patent
He et al.

(10) Patent No.: US 11,930,622 B2
(45) Date of Patent: Mar. 12, 2024

(54) SYSTEM AND METHOD FOR A 5G COOLING MODULE THAT DIRECTS HEAT INTO A THERMAL LOOP ASSOCIATED WITH A PROCESSING DEVICE

(71) Applicant: Dell Products, LP, Round Rock, TX (US)

(72) Inventors: Qinghong He, Austin, TX (US); Travis C. North, Cedar Park, TX (US)

(73) Assignee: Dell Products LP, Round Rock, TX (US)

( * ) Notice: Subject to any disclaimer, the term of this patent is extended or adjusted under 35 U.S.C. 154(b) by 247 days.

(21) Appl. No.: 17/571,064

(22) Filed: Jan. 7, 2022

(65) Prior Publication Data
US 2023/0225083 A1    Jul. 13, 2023

(51) Int. Cl.
*H05K 7/20* (2006.01)
*H05K 9/00* (2006.01)

(52) U.S. Cl.
CPC ..... *H05K 7/20336* (2013.01); *H05K 7/20136* (2013.01); *H05K 7/20409* (2013.01); *H05K 9/0024* (2013.01)

(58) Field of Classification Search
CPC .................. H05K 7/20336; H05K 7/20136
See application file for complete search history.

(56) References Cited

U.S. PATENT DOCUMENTS

| | | | |
|---|---|---|---|
| 6,567,269 B2 * | 5/2003 | Homer | G06F 1/203 |
| | | | 174/16.3 |
| 9,868,551 B2 | 1/2018 | Smith | |
| 9,908,643 B2 | 3/2018 | Smith | |
| 10,392,135 B2 | 8/2019 | Smith | |
| 10,485,135 B2 * | 11/2019 | He | F28D 15/0233 |
| 2016/0118315 A1 | 4/2016 | Smith | |
| 2018/0059744 A1 | 3/2018 | Brazel | |
| 2020/0113086 A1 | 4/2020 | Fackler | |
| 2020/0396871 A1 | 12/2020 | Yun | |

FOREIGN PATENT DOCUMENTS

WO     2020/070250 A1     4/2020

\* cited by examiner

*Primary Examiner* — Sherman Ng
(74) *Attorney, Agent, or Firm* — Prol Intellectual Property Law, PLLC; H. Kenneth Prol

(57) ABSTRACT

An information handling system with a cooling system may include a processor; a memory; a power management unit (PMU); a cooling system including: a fan; and a cooling system heat pipe; a detachable thermal module including: a first heat conductive element to be operatively coupled to a heat producing components such as a processor, a radio module, or other component; a second heat conductive element to be operatively coupled to the cooling system heat pipe of the cooling system; and a detachable thermal module heat pipe formed between the first heat conductive element and the second heat conductive element.

20 Claims, 7 Drawing Sheets

SYSTEM AND METHOD FOR A 5G COOLING MODULE THAT DIRECTS HEAT INTO A THERMAL LOOP ASSOCIATED WITH A PROCESSING DEVICE

FIELD OF THE DISCLOSURE

The present disclosure generally relates to a cooling system of an information handling system. The present disclosure more specifically relates to a system and method to cool a 5G radio module of the information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a heat producing component such as a radio module (e.g., 5G) used to communicate with the information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
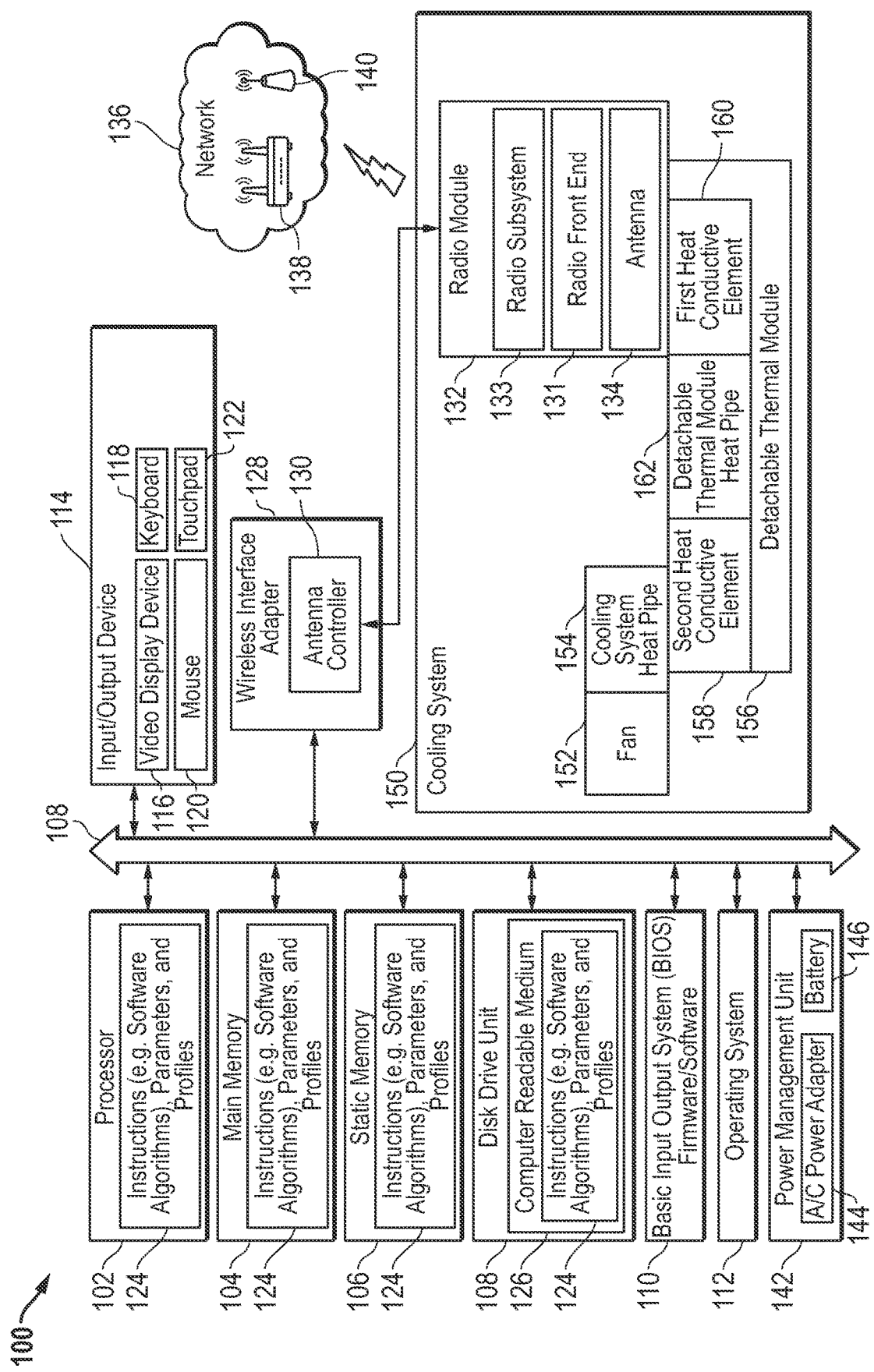
FIG. 1 is a block diagram illustrating an information handling system with a detachable thermal module according to an embodiment of the present disclosure.

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Information handling systems may include one or more antennas used to operatively couple the information handling system to a wireless network. These information handling systems may be made mobile so that a user may travel with an information handling system from location to location and still access a wireless network. The antennas may be used to operatively couple the information handling system to a wireless network that using, for example, 5G standards to do so. Other standards may be used, and the present specification contemplates those uses. With the use of edge computing and containerized applications for computing offload, the amount of data transmitted to and from the information handling system may be relatively higher. As such 5G, sub-6 GHz, and mmWave frequencies may be used to facilitate this increased level of data throughput. As a result, power consumption at the radio module (e.g., antenna radio and associated circuitry) may peak at, for example, 13 Watts with an average power consumption of 6.2 Watts. After some time, this level of power consumption may create a cooling and control challenge similar to that at a central processing unit (CPU) (e.g., a processor). This heat, if not expelled from within the information handling system, may cause damage to the radio module and other components. Additionally, the heat may heat a portion of the chassis of the information handling system such that it could cause injury or discomfort to a user when touched. Indeed, with an average power consumption of 6.2 Watts, the temperature of the chassis may be driven up as high as 140° F. (60° C.).

The present specification describes a cooling system within an information handling system that reduces the heat accumulated by the use of the radio module such as a 5G radio module. A cooling system within the information handling system may include a fan and a cooling system heat pipe. The cooling system heat pipe may be part of the information handling system that helps to regulate heat at the CPU or other processing device. In embodiments described herein, the information handling system further includes a detachable thermal module. The detachable thermal module may be operatively coupled to the radio module via a first heat conductive element. The detachable thermal module may be operatively coupled to the cooling system heat pipe via a second heat conductive element. A detachable thermal module heat pipe may be operatively coupled between the first heat conductive element and the second heat conductive element so that heat from the radio module received at the first heat conductive element is transferred to the second heat conductive element operatively coupled to the cooling system heat pipe. This allows the heat emitted by the radio module to be passed to the cooling system heat pipe of the cooling system present in the information handling system. In design of information handling system models, various options or upgrades may be available in some model variations. For example, not all products may be sold with 5G wireless capability. The detachable thermal module may, therefore, be added into the chassis of the information handling system at the radio module when, for example, the information handling system is to include a 5G radio module that may create the increased temperatures described herein. The detachable thermal module may provide cooling for such an upgraded radio system with limited additional cost.

In an embodiment, the first heat conductive element and second heat conductive element may include a thermal pad used to conduct heat received at the first heat conductive element away from the 5G radio module and conduct heat received at the second heat conductive element to the cooling system heat pipe of the cooling system already designed for inclusion within the information handling system. The detachable thermal module heat pipe operatively coupled to the first heat conductive element and second heat conductive element may, in an example embodiment, include a vapor chamber. A vapor chamber, in an example embodiment, may include a tubular and sealed pipe with a working fluid therein. As the vapor chamber receives heat from a source such as the radio module, the working fluid may absorb that heat and move from one state to another (e.g., liquid state into a gas state) as the temperature changes. Heat received in the vapor chamber may be dumped at the second heat conductive element and into the cooling system heat pipe.

In an embodiment, the first heat conductive element that is operatively coupled to the radio module may include an electromagnetic interference (EMI) shielding. The EMI shielding may be operatively coupled to the first heat conductive element and formed thereon such that, when installed against the 5G module, the EMI shielding surrounds the 5G module. In an embodiment, the EMI shielding may include a grounding source used to ground the EMI shielding when installed.

The first heat conductive element and second heat conductive element may each include a coupling device used to couple the first heat conductive element to the radio module and the second heat conductive element to the cooling system heat pipe. This coupling device may be any permanent coupling device, in an embodiment, such as a glue, soldering, or other permanent coupling process and device. In another embodiment, the coupling device may be semi-permanent such as clips, fasteners, press fit attachment or other methods such that the detachable thermal module may be removed to access the radio module and/or cooling system heat pipe.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system 100 may include memory (volatile (e.g., random-access memory, etc.), non-volatile (read-only memory, flash memory etc.) or any combination thereof), one or more processing resources, such as a central processing unit (CPU), a graphics processing unit (GPU), hardware or software control logic, or any combination thereof. Additional components of the information handling system 100 may include one or more storage devices, one or more communications ports for communicating with external devices, as well as various input and output (I/O) devices 114, such as a keyboard 118, the touchpad 122, a mouse 120, a headset, a stylus, a video/graphics display device 116, or any combination thereof. Portions of an information handling system 100 may themselves be considered information handling systems 100.

Information handling system 100 may include devices or modules that embody one or more of the devices or execute instructions for one or more systems and modules. The information handling system 100 may execute instructions (e.g., software algorithms), parameters, and profiles 124 that may operate on servers or systems, remote data centers, or on-box in individual client information handling systems according to various embodiments herein. In some embodiments, it is understood any or all portions of instructions (e.g., software algorithms), parameters, and profiles 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 may include memory such as main memory 104, static memory 106, or other memory of computer readable medium 126 storing instructions (e.g., software algorithms), parameters, and profiles 124 executable by the antenna controller 130, embedded controller, or any other processing device (e.g., processor 102), and drive unit 108 (volatile (e.g., random-access memory, etc.), non-volatile memory (read-only memory, flash memory etc.) or any combination thereof. The information handling system 100 may also include one or more buses 148 operable to transmit communications between the various hardware components such as any combination of various I/O devices 114 as well as between processors 102, the embedded controller, the operating system (OS) 112, the basic input/output system (BIOS) 110, the wireless interface adapter 128 the radio module 132, and the power management unit (PMU) 142, among other components described herein.

The information handling system 100 may further include a video/graphics display device 116. The video/graphics display device 116 in an embodiment may function as a liquid crystal display (LCD), an organic light emitting diode (OLED), a flat panel display, or a solid-state display. Additionally, the information handling system 100 may include an I/O device 114 that allows the user to interface with the information handling system 100 via the video/graphics display device 116, such as a cursor control device (e.g., the mouse 120, touchpad 122, or gesture or touch screen input), and the keyboard 118 or stylus, among others. Various drivers and control electronics may be operatively coupled to operate the I/O device 114 according to the embodiments described herein.

The network interface device in FIG. 1 is shown as wireless interface adapter 128 but may also be a wired network interface device as is understood in the art and may provide connectivity to a network 136, e.g., a wide area network (WAN), a local area network (LAN), wireless local area network (WLAN), a wireless personal area network (WPAN), a wireless wide area network (WWAN), or other network. The network interface device shown as wireless interface adapter 128 may provide connectivity to a network 136 via operation of a radio module 132 being controlled by an antenna controller 130. In an embodiment, the radio module 132 may be operatively coupled to the antenna controller 130 but may form a different physical device in some embodiments. It is appreciated that any number of radios 133 and RF front ends 131 may be associated with the radio module 132 and may also be associated with a plurality of antennas 134 within the information handling system and may operate under any wireless protocol described herein. In an embodiment, a radio module 132 operatively coupled to the detachable thermal module 156 may include an antenna 134 as well as a radio 133 and front end 131. In an alternative embodiment, the radio module 132 coupled to the detachable thermal module 156 may include an antenna 134 located outside any EMI shielding and with the radio 133 and front end 131 operatively coupled to the antenna 134. In an example embodiment, the radio module 132 may be a 5G mmWave radio module and may be referred to as a 5G module or 5G radio module herein. Connectivity to a network 136 may be via wired or wireless connection. The wireless interface adapter 128 may operate in accordance with any wireless data communication standards in various embodiments. To communicate with a wireless local area network, standards including IEEE 802.11 a/h/j/n/ac/ax WLAN standards, IEEE 802.15 WPAN standards, WWAN such as 3GPP or 3GPP2, or similar wireless standards may be used. In some aspects of the present disclosure, one wireless interface adapter 128 may operate two or more wireless links. Information handling systems 100 including those that are mobile in embodiments of the present disclosure may employ a plurality of antenna systems for communication via wireless links operating on a variety of radio access technologies (RAT). For example, a mobile information handling system in an embodiment of the present disclosure may employ separate antenna systems for Wi-Fi signals, wireless wide area network (WWAN) signals, Bluetooth signals, and wireless local area network (WLAN) signals. WWAN signals in embodiments of the present disclosure may include 2G standards such as GSM, 2.5G standards such as GSM EDGE and GPRS, 3G standards such as W-CDMA/UMTS and CDMA 2000, 4G standards such as LTE, LTE-A, LTE-LAA, 5G standards, small cell WWAN, and the like. Wi-Fi and WLAN signals in embodiments of the present disclosure may include wireless links adhering to standards such as, for example, IEEE 802.11 WiFi, IEEE 802.11ad WiGig, IEEE 802.15 WPAN, and IEEE 802.11ax-2021 (e.g., WiFi 6 and 6E, 6 GHz technologies). In other aspects, several antenna systems may be available for each RAT to enable aggregated data communications such as via plural multiple in, multiple out (MIMO) streams (e.g., Wi-Fi MIMO or cellular MIMO) to enhance data bandwidth or reliability. In some examples, an information handling system 100 may support multi-RAT radios (4G, 5G, WLAN) that require simultaneous transmission using multiple antennas to support various modes of transmission (e.g., uplink (UL) MIMO and 5G E-UTRAN new radio (EN-DC)). With 5G technology, these information handling systems may use, in an example embodiment, sub-6 GHz antennas and mmWave antennas, resulting in several antennas operating in the information handling system.

Wireless interface adapter 120 may connect to any combination of macro-cellular wireless connections including 2G, 2.5G, 3G, 4G, 5G, emerging 6G or the like from one or more service providers or privately administered network providers. The wireless interface adapter 128 may also connect to any WLAN networks such as Wi-Fi networks. Utilization of radiofrequency communication bands according to several example embodiments of the present disclosure may include bands used with the WLAN standards and WWAN carriers, which may operate in both licensed and unlicensed spectrums.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 136 may communicate voice, video or data over the network 136. Further, the instructions 124 may be transmitted or received over the network 136 via the network interface device or wireless interface adapter 128.

The information handling system 100 may include a set of instructions 124 that may be executed to cause the computer system to perform any one or more of the methods or computer-based functions disclosed herein. For example, instructions 124 may be executed by an antenna controller 130 and radio module, and may include software agents, or other aspects or components used to execute the methods and systems described herein. Various software modules comprising application instructions 124 may be coordinated by an operating system (OS) 112, and/or via an application programming interface (API). An example OS 112 may include Windows®, Android®, and other OS types. Example APIs may include Win 32, Core Java API, or Android APIs. Additionally, execution of the instructions described herein may be via execution of firmware by the antenna controller 130.

The disk drive unit 108 may include a computer-readable medium 126 in which one or more sets of instructions 124 such as software may be embedded and executed by the antenna controller 130, processor 102, and/or embedded controller, in an embodiment. Similarly, main memory 104 and static memory 106 may also contain a computer-readable medium for storage of one or more sets of instructions, parameters, or profiles 124. The disk drive unit 108 and static memory 106 may also contain space for data storage. Further, the instructions 124 may embody one or more of the methods or logic as described herein. For example, instructions relating to and executed by the antenna controller 130, embedded controller, processor 102, software algorithms, processes, and/or methods may be stored here. In a particular embodiment, the instructions, parameters, and profiles 124 may reside completely, or at least partially, within the main memory 104, the static memory 106, and/or within the disk drive 108 during execution by the processor 102 of information handling system 100. As explained, some or all of the instructions 124 to be executed by a processor 102 for software applications may be executed locally, remotely or a combination thereof. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The computer executable instructions 124 to be executed by the antenna controller 130, processor 102, or embedded controller may be stored in static memory 106, or the disk drive unit 108 on a computer-readable medium 126 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

As described herein, the information handling system 100 may further include a power management unit (PMU) 142 (a.k.a. a power supply unit (PSU)). The PMU 142 may manage the power provided to the components of the information handling system 100 such as the processor 102, components of a cooling system such as a fan, one or more disk drive units 108, a graphical processing unit (GPU), a video/graphic display device 116 or other I/O device 114 such as the stylus, and other components that may require power when a power button has been actuated by a user. In an embodiment, the PMU 142 may monitor power levels and be electrically coupled to the information handling system 100 to provide this power and coupled to bus 148 to provide or receive data or instructions. The PMU 142 may regulate power from a power source such as a battery 146 or A/C power adapter 144. In an embodiment, the battery 146 may be charged via the A/C power adapter 144 and provide power to the components of the information handling system 100 via wired connections as applicable, or when A/C power from the A/C power adapter 144 is removed.

As described herein, the information handling system 100 includes a cooling system 150. Components of the cooling system 150 may be used to cool a processing device such as the processor 102, a CPU, GPU, or other processing device. Processing devices, especially during a full processing workload, create heat that must be dissipated from the processing device. If not, the heat may exceed optimal working temperatures causing damage to the processor and/or damage to other components of the information handling system. Portions of the cooling system 150 may dissipate this heat away from the processing device. In an example embodiment, the processing device may be operatively coupled to a heat pipe. The heat pipe of the cooling system 150 associated with the processing device may be one of a vapor chamber, a variable conductance heat pipe (VCHP), a pressure-controlled heat pipe (PCHP), a diode heat pipe, among others. In these examples, heat is transferred away from the processing device to, in an example embodiment, passive cooling device such as radiating fins or active cooing devices including a fan 152. The heat pipe that may be used to cool the processing device is referred to herein as the cooling system heat pipe 154. This cooling system heat pipe 154 may be placed within the chassis of the information handling system as a permanent and existing component used to continuously cool the processing device.

Components of the cooling system 150 described herein may also be used to cool a radio module 132. As described herein, the radio module 132 may be a radio module 132 that operates using a 5G protocol. These 5G protocols include wireless protocols that operate at relatively higher frequencies. These higher frequencies include those associated with new radio frequency range 1 (NRFR1), NRFR2, mmWave frequencies as well as other frequencies above 6 GHz. In example embodiments, the 5G radio module 132 may dissipate up to 6.2 Watts during use. If left unmanaged, the heat created via this level of power used at the 5G radio module 132 may increase the temperature of the chassis of the information handling system causing injury or discomfort to the user. Further, the heat created by operating the 5G radio module 132 at these power levels may cause damage to the 5G radio module 132 or other components within the chassis of the information handling system 100. However, it is appreciated that in some example information handling systems, a 5G radio module 132 may not be present. Indeed, it is appreciated that a user may custom "build" an information handling system model online by accessing a manufacturers website, requesting specific features be present in the information handling system, and ordering that information handling system according to those requested features. Among these selectable features is the inclusion or exclusion of the 5G radio module 132. Because the 5G radio module 132 may be included within the chassis of the ordered information handling systems in some examples or may not be included, the present specification describes a detachable thermal module 156. In the examples where the 5G radio module 132 is present and placed within the chassis of the information handling system 100, the detachable thermal module 156 may also be added in order to provide a cooling system for the 5G radio module 132. Although the present specification describes that the heat producing element within the information handling system is a 5G radio module, the present specification contemplates that the detachable thermal module 156 may be used to dissipate heat from any heat producing element within the information handling system. Example heat producing elements within the information handling system may include a graphic processing unit (GPU), a central processing unit (CPU) or other processing device, among others including additional radio modules whether they are 5G radio modules or not. Although a cooling system may be present within the information handling system 100 (e.g., a heat pipe, fan, metallic fin array, among others) used to cool the CPU, the present specification contemplates that the detachable thermal module 156 may also be used to cool this CPU or may, alternatively be used to cool those heat producing elements within the information handling system that may affect the amount of heat produced within the chassis of the information handling system.

The detachable thermal module 156 may include a first heat conductive element 160. The first heat conductive element 160 may be formed into a sheet and, in an example embodiment, be made of metal. The metal may be a heat conductive and heat diffusing metal that receives heat from a 5G radio module 132 and diffuses the heat into a detachable thermal module heat pipe 162. In an example embodiment, the first heat conductive element 160 may be made of aluminum or copper or other heat conductive metal. In an embodiment, the first heat conductive element 160 may include a thermal pad (also called a thermally conductive pad) that aids in the conduction of heat away from the 5G radio module 132 and into the first heat conductive element 160.

In an embodiment, the first heat conductive element 160 is operatively coupled to the 5G radio module 132 permanently using a glue or other permanent fastening device. In another example embodiment, because the detachable thermal module 156 may be removed to access the 5G radio module 132, a semipermanent coupling device may be used. This semipermanent coupling device may include a clamp, clip, or other fastening device that allows the first heat conductive element 160 of the detachable thermal module 156 to be removed from the 5G radio module 132 in order to access the 5G radio module 132 for repairs or replacement.

In an example embodiment, the first heat conductive element 160 may include electromagnetic interference (EMI) shielding. The EMI shielding prevents EMI from affecting the operations of the 5G radio module 132 or other components within the chassis of the information handling system 100. The EMI shielding may reduce the coupling of radio waves, electromagnetic fields, and electrostatic fields at the first heat conductive element 160. In an embodiment, the EMI shielding may be operatively coupled to a grounding source within the chassis of the information handling system 100 in order to provide effective shielding of the 5G radio module 132.

The first heat conductive element 160 may be operatively coupled to a detachable thermal module heat pipe 162. The first heat conductive element 160 may be operatively coupled to the detachable thermal module heat pipe 162 using, for example, a glue, via soldering, or other coupling mechanism or process in order to secure the first heat conductive element 160 to the detachable thermal module heat pipe 162 such that the heat at the first heat conductive element 160 may also be diffused into the detachable thermal module heat pipe 162. The detachable thermal module heat pipe 162 may be any type of heat pipe that allows for the heat at the first heat conductive element 160 to diffuse into the detachable thermal module heat pipe 162 and to a second heat conductive element 158. The detachable thermal module heat pipe 162 may be one of a vapor chamber, a variable conductance heat pipe (VCHP), a pressure-controlled heat pipe (PCHP), a diode heat pipe, among others. In an example embodiment, the detachable thermal module heat pipe 162 may be a vapor chamber that includes a hermetically sealed hollow vessel with a working fluid within the hollow. As the working fluid is heated at or around the first heat conductive element 160, the working fluid may be vaporized and allowed to flow to a condensing surface such as those surfaces within the detachable thermal module heat pipe 162 close to the second heat conductive element 158. In an embodiment described herein, the relative temperatures at the end of the detachable thermal module heat pipe 162 near the first heat conductive element 160 and the end of the detachable thermal module heat pipe 162 near the second heat conductive element 158 may allow for the vaporized working fluid to condense at or near the second heat conductive element 158 thereby transferring heat from the first heat conductive element 160 to the second heat conductive element 158.

The second heat conductive element 158 may be similar in form to the first heat conductive element 160. In an embodiment, the second heat conductive element 158 may be formed into a sheet and, in an example embodiment, be made of metal. The metal may be a heat conductive and heat diffusing metal that receives heat from the second heat conductive element 158 and diffuses the heat into the cooling system heat pipe 154. In an example embodiment, the second heat conductive element 158 may be made of aluminum or copper or other heat conductive metal. In an embodiment, the second heat conductive element 158 may include a thermal pad similar to the thermal pad affixed to the first heat conductive element 160. The thermal pad of the second heat conductive element 158 may also aid in the conduction of heat away from the detachable thermal module heat pipe 162 and into the cooling system heat pipe 154.

In an embodiment, the second heat conductive element 158 is operatively coupled to the cooling system heat pipe 154 permanently using a glue or other permanent fastening device. In another example embodiment, because the detachable thermal module 156 may be removed to access the 5G radio module 132 or other components within the chassis of the information handling system 100, a semipermanent coupling device may be used to secure the second heat conductive element 158 to the cooling system heat pipe 154. This semipermanent coupling device may include a clamp, clip, or other fastening device that allows the second heat conductive element 158 of the detachable thermal module 156 to be removed from the cooling system heat pipe 154 in order to access the 5G radio module 132 and other components for repairs or replacement of the devices within the chassis of the information handling system 100.

As described herein, the cooling system 150 of the information handling system 100 may include a fan 152 that is operatively coupled to the cooling system heat pipe 154. Heat generated at the processing device may be diffused through the cooling system heat pipe 154 to the fan 152. The cooling system 150 may also include, in an example embodiment, an array of metallic fins that are operatively coupled to the cooling system heat pipe 154. The array of fins may absorb heat from the cooling system heat pipe 154. As air is passed over the array of fins and the cooling system heat pipe 154 by operation of the fan 152, the heat diffused from the processing device through the cooling system heat pipe 154 may be blown through a vent formed in the chassis of the information handling system 100.

The detachable thermal module 156 may similarly diffuse heat produced at the 5G radio module 132 through the first heat conductive element 160, the detachable thermal module heat pipe 162, and the second heat conductive element 158 and into the cooling system heat pipe 154 that the second heat conductive element 158 is operatively coupled to. The heat diffused from the second heat conductive element 158 and into the cooling system heat pipe 154 may also be passed into the array of fins and the air current passed over the second heat conductive element 158, array of fins, and cooling system heat pipe 154 by the fan 152 cools those components. Hot air from these components may similarly be passed out of the vent formed into the chassis of the information handling system 100. The detachable thermal module 156, therefore, uses the cooling system 150 already present in the information handling system 100 used to cool the processing device (e.g., processor 102). The detachable thermal module 156 ties the relatively lower power 5G radio module 132 to the cooling system 150 of the processor 102 (CPU or GPU) together in order to take advantage of the cooling system's 150 capacity to cool the 5G radio module 132. The chance of all three components (e.g., the processor 102 such as a CPU or GPU and the 5G radio module 132) coincidently running at maximum power is low thereby allowing for the thermal coupling of the detachable thermal module 156 to the cooling system heat pipe 154 to be sufficient for cooling all three heat generating components especially if 5G radio module 132 provides for compute offload to the edge from processor 102 such as a CPU or GPU. Additionally, the costs associated with manufacturing the detachable thermal module 156 may be relatively low reducing the costs that would otherwise be needed to create a separate cooling system for the 5G radio module 132.

In an embodiment, the information handling system 100 may include one or more of an OS 112, and basic BIOS firmware/software 110 or application programs that may be executable instructions 124 executed at any processor 102 and stored at one or more memory devices 104, 106, or 180. BIOS firmware/software 110 functions to initialize the information handling system 100 on power up, to launch an OS 112, and to manage input and output interactions between the OS 112 and the other elements of information handling system 100 including the radio module 132 and antenna controller 130. In a particular embodiment, BIOS firmware/software 110 resides in memory 104, and include machine-executable code that is executed by processor 102 to perform various functions of information handling system 100 as described herein. In another embodiment (not illustrated), application programs and BIOS firmware/software 110 reside in another storage medium of the information handling system 100. For example, application programs and BIOS firmware/software 110 can reside in drive unit 108, in a ROM (not illustrated) associated with the information handling system 100, in an option-ROM (not illustrated) associated with various devices of the information handling system 100, in a storage system (not illustrated) associated with network channel of a wireless interface adapter 128, in another storage medium of the information handling system 100, or a combination thereof. Executable code instructions 124 for application programs and BIOS firmware/software 110 can each be implemented as single programs, or as separate programs carrying out the various features as described herein.

Figure 2:
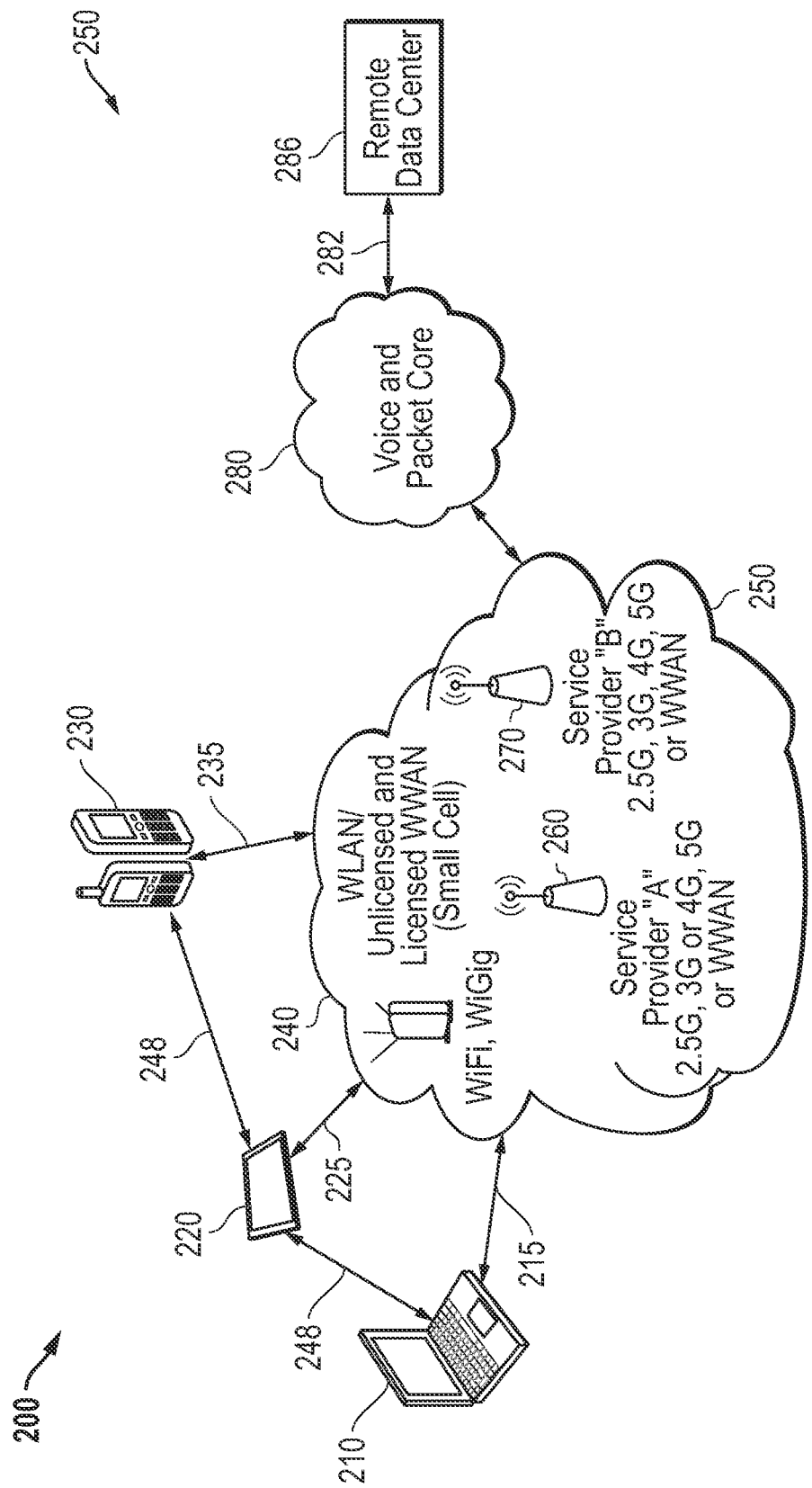
FIG. 2 is a block diagram of a network environment offering several communication protocol options and mobile information handling systems according to an embodiment of the present disclosure.

FIG. 2 illustrates a network 200 that can include one or more endpoint devices 210, 220, 230. The endpoint devices 210, 220, 230 shown in FIG. 2 may be similar to the information handling system 100 described in connection with FIG. 1. In a particular embodiment, network 200 includes networked mobile endpoint devices 210, 220, 230, wireless network access points, and multiple wireless connection link options. A variety of additional computing resources of network 200 may include client mobile information handling systems, data processing servers, network storage devices, local and wide area networks, a RAN service provider, or other resources as needed or desired. As partially depicted, endpoint devices 210, 220, 230 may be a laptop computer, tablet computer, 360-degree convertible systems, wearable computing devices, or a smart phone device. These mobile endpoint devices 210, 220, 230, may access a wireless local network 240, or they may access a macro-cellular network 250. For example, the wireless local network 240 may be the wireless local area network (WLAN), a wireless personal area network (WPAN), or a wireless wide area network (WWAN). In an example embodiment, LTE-LAA WWAN may operate with a small-cell WWAN wireless access point option. In an embodiment, these networks may provide cloud computing resources for the individual mobile endpoint devices 210, 220, 230.

Since WPAN or Wi-Fi Direct connection 248 and WWAN networks can functionally operate similar to WLANs, they may be considered as wireless local area networks (WLANs) for purposes herein. Components of a WLAN may be connected by wireline or Ethernet connections to a wider external network such as a voice and packet core 280. For example, wireless network access points or base stations may be connected to a wireless network controller and an Ethernet switch. Wireless communications across wireless local network 240 may be via standard protocols such as IEEE 802.11 Wi-Fi, IEEE 802.11ad WiGig, IEEE 802.15 WPAN, IEEE 802.11ax-2021, (e.g., Wi-Fi 6 and 6E, 6 GHz technologies), or 5G small cell WWAN communications such as gNodeB, eNodeB, or similar and future wireless network protocols and access points. Alternatively, other available wireless links within network 240 may include macro-cellular connections 250 via one or more service providers 260 and 270. Again, as described herein, the organization of a number of endpoint devices 210, 220, 230 may be defined by the endpoint devices 210, 220, 230 accessing a specific or number of specific base stations. As described herein, the endpoint devices 210, 220, 230 may be operatively coupled to any of the macro-cellular connections 250 via one or more service providers 260 and 270 or to the wireless local area networks (WLANs) selectively. Service provider macro-cellular connections may include 2G standards such as GSM, 2.5G standards such as GSM EDGE and GPRS, 3G standards such as W-CDMA/UMTS and CDMA 2000, 4G standards, or 5G standards including, LTE, and LTE Advanced, LTE-LAA, small cell WWAN, or other upcoming 3GPP protocols, and the like.

Wireless local network 240 and macro-cellular network 250 may include a variety of licensed, unlicensed or shared communication frequency bands as well as a variety of wireless protocol technologies ranging from those operating in macrocells, small cells, picocells, or femtocells. As described herein, utilization of RF communication bands according to several example embodiments of the present disclosure may include bands used with the WLAN standards and WWAN carriers which may operate in both licensed and unlicensed spectrums. In additional examples, WWAN carrier licensed bands may operate at the new radio frequency range 1 (NRFR1), NRFR2, bands, and other known bands as described herein per the operation of the converged 5G antenna. Each of these frequencies used to communicate over the network 240 may be based on the radio access network (RAN) standards that implement, for example, eNodeB or gNodeB hardware connected to mobile phone networks (e.g., cellular networks) used to communicate with the endpoint devices 210, 220, 230. In the example embodiment, mobile endpoint devices 210, 220, 230 may also include both unlicensed wireless RF communication capabilities as well as licensed wireless RF communication capabilities. For example, licensed wireless RF communication capabilities may be available via a subscriber carrier wireless service operating the cellular networks. With the licensed wireless RF communication capability, an WWAN RF front end of the endpoint devices 210, 220, 230 may operate on a licensed WWAN wireless radio with authorization for subscriber access to a wireless service provider on a carrier licensed frequency band. WLAN such as Wi-Fi (e.g., Wi-Fi 6) may be unlicensed.

In some embodiments according to the present disclosure, a networked mobile endpoint device 210, 220, 230 may each have a plurality of wireless network interface systems or radio protocol subsystems capable of transmitting simultaneously within several communication bands or even utilizing a shared communication frequency band access multiple protocols. That communication within a shared communication frequency band may be sourced from different protocols on parallel wireless network interface systems or from a single wireless network interface system capable of transmitting and receiving from multiple protocols. Similarly, a single antenna or the plurality of antennas in each endpoint device 210, 220, 230 may be used on each of the wireless communication devices such as according to embodiments herein and may be suited to plural RF bands. As described herein, each of the endpoint devices 210, 220, 230 may include a 5G antennas that are capable of transmitting and receiving data using an FR1 and FR2 frequency concurrently to communicate with multiple networks. Example competing protocols may be local wireless network access protocols such as Wi-Fi/WLAN, WiGig, and small cell WWAN in an unlicensed, shared communication frequency band. Within local portion of wireless network 250 access points for Wi-Fi or WiGig as well as small cell WWAN connectivity may be available in emerging 5G technology. This may create situations where a plurality of antenna systems are operating on an endpoint device 210, 220, 230 via concurrent communication wireless links on both WLAN and WWAN radios and antenna systems. In some embodiments, concurrent wireless links may operate within the same, adjacent, or otherwise interfering communication frequency bands. The antenna may be a transmitting antenna that includes high-band, medium-band, low-band, and unlicensed band transmitting antennas in embodiments herein. The antenna may cooperate with other antennas in a N×N MIMO (where "N" is any number) array configuration according to the embodiments described herein. Alternatively, embodiments may include a single transceiving antennas capable of receiving and transmitting, and/or more than one transceiving antennas. Each of the antennas included in the endpoint devices 210, 220, 230 in an embodiment may be subject to the FCC regulations on specific absorption rate (SAR).

The voice and packet core network 280 shown in FIG. 2 may contain externally accessible computing resources and connect to a remote data center 286. The voice and packet core network 280 may contain multiple intermediate web servers or other locations with accessible data (not shown). The voice and packet core network 280 may also connect to other wireless networks similar to 240 or 250 and additional mobile endpoint devices 210, 220, 230 or similar connected to those additional wireless networks. Connection 282 between the wireless network 240 and remote data center 286 or connection to other additional wireless networks may be via Ethernet or another similar connection to the world-wide-web, a WAN, a LAN, another WLAN, or other network structure. Such a connection 282 may be made via a WLAN access point/Ethernet switch to the external network and be a backhaul connection. The access point may be connected to one or more wireless access points in the WLAN before connecting directly to a mobile information handling system or may connect directly to one or more mobile endpoint devices 210, 220, 230. Alternatively, mobile endpoint devices 210, 220, 230 may connect to the external network via base station locations at service providers such as 260 and 270. These service provider locations may be network connected via backhaul connectivity through the voice and packet core network 280.

Remote data centers 286 may include web servers or resources within a cloud environment that operate via the voice and packet core 280 or other wider internet connectivity. For example, remote data centers can include additional information handling systems, data processing servers, network storage devices, local and wide area networks, or other resources as needed or desired. In an embodiment, the remote data center 286 may include one or more servers. The remote data center 286 may include edge compute servers located near 5G WLAN small cell radios or 5G cellular substations 260, 270 in some embodiments. In another embodiment, the on-demand network slice overlay optimization system 201 may be directly accessible by the endpoint devices 210, 220, 230 via the one or more networks. Having such remote capabilities such as edge computing access may permit fewer resources to be maintained at the mobile endpoint devices 210, 220, 230 allowing streamlining and efficiency within those devices. Similarly, remote data center such as edge computing access permits fewer resources to be maintained in other parts of network 200. Thus, high data bandwidth wireless links are desired for endpoint devices 210, 220, 230 to interface with greater and greater resources located on a network edge or as a remote data center. This requires more antennas, more power, and more heat, in less space within the endpoint devices 210, 220, 230.

Although network connections 215, 225, and 235 are shown connecting wireless adapters of mobile endpoint devices 210, 220, 230 to wireless networks 240 or 250, a variety of wireless links are contemplated. Wireless communication may link through a wireless access point (Wi-Fi or WiGig), through unlicensed WWAN small cell base stations such as in network 240 or through a service provider tower and base stations such as that shown with service provider A 260 or service provider B 270 and in network 250. In other aspects, mobile endpoint devices 210, 220, 230 may communicate intra-device via intra-device connections 248 when one or more of the mobile endpoint devices 210, 220, 230 are set to act as an access point or even potentially an WWAN connection via small cell communication on licensed or unlicensed WWAN connections. For example, one of the endpoint devices 210, 220, 230 may serve as a Wi-Fi hotspot in an embodiment. Concurrent wireless links to the endpoint devices 210, 220, 230 may be connected via any access points including other mobile information handling systems as illustrated in FIG. 2.

Figure 3:
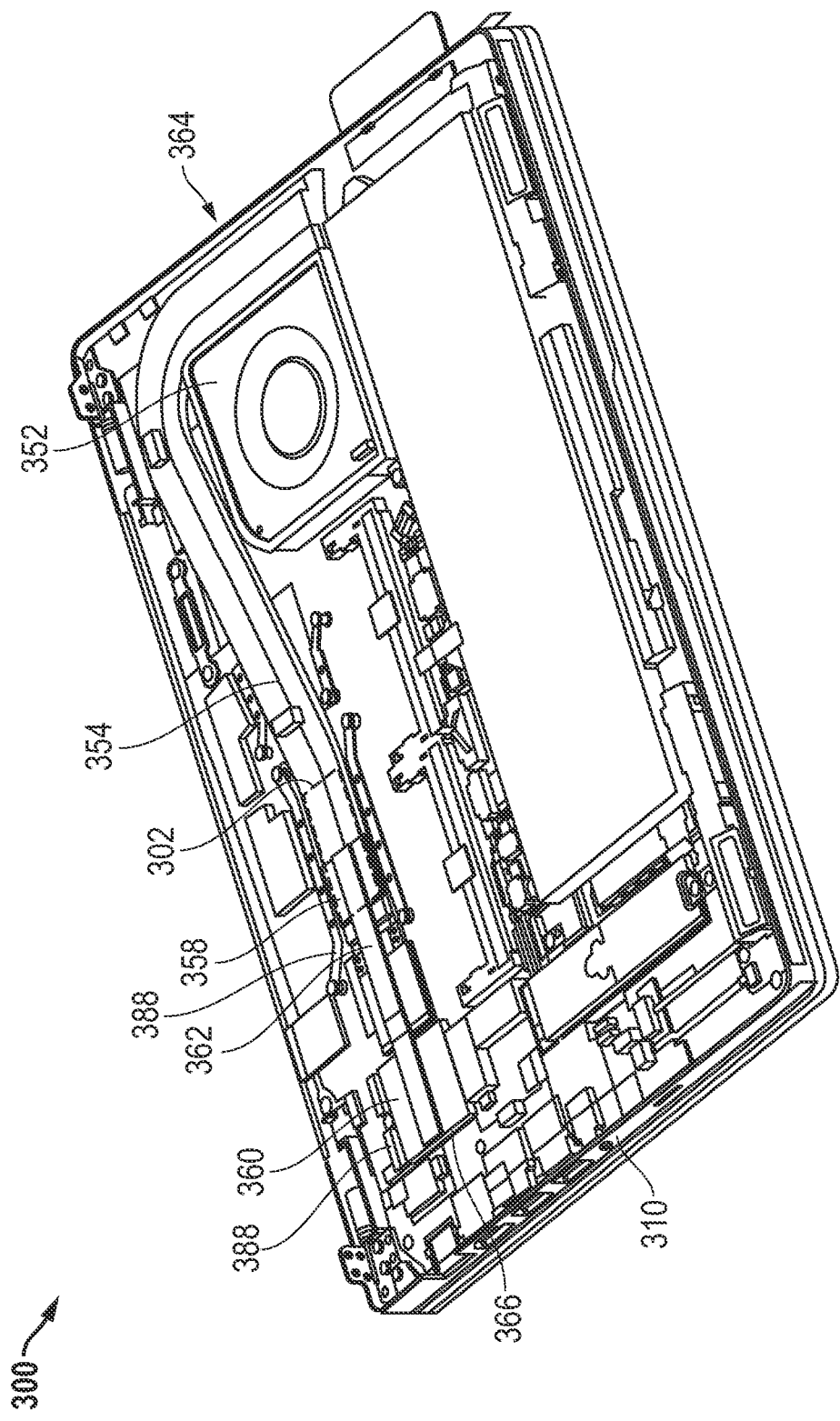
FIG. 3 is a graphic diagram of a detachable thermal module placed in thermal communication with a 5G radio module and a cooling system within the information handling system according to an embodiment of the present disclosure.

FIG. 3 is a graphic diagram of a detachable thermal module 356 placed in thermal communication with a 5G radio module and an existing cooling system within the information handling system 300 according to an embodiment of the present disclosure. FIG. 3 shows an example layout of the fan 352, cooling system heat pipe 354, location of processor 302, detachable thermal module 356, second heat conductive element 358, first heat conductive element 360, and detachable thermal module heat pipe 362 relative to each other in one embodiment. The present specification contemplates other layouts of these components within a chassis 310 of the information handling system 300 in other embodiments.

As described herein, the information handling system 300 includes a detachable thermal module 356. In those information handling systems 300 where a 5G radio module (not shown in FIG. 3 but placed under the first heat conductive element 360) is added within the chassis of the information handling system 300, the detachable thermal module 356 may be used to cool the 5G radio module by dissipating the heat via the first heat conductive element 360, though the detachable thermal module heat pipe 362, to the second heat conductive element 358, and into the cooling system heat pipe 354.

The first heat conductive element 360 may be formed into a sheet and, in an example embodiment, be made of metal or other heat conductive material. The metal may be a heat conductive and heat diffusing metal that receives heat from a 5G radio module and diffuses the heat into a detachable thermal module heat pipe 362. In an example embodiment, the first heat conductive element 360 may be made of aluminum or copper or other heat conductive metal. In an embodiment, the first heat conductive element 360 may include a thermal pad (also called a thermally conductive pad) that aids in the conduction of heat away from the 5G radio module and into the first heat conductive element 360.

In an embodiment, the first heat conductive element 360 is operatively coupled to the 5G radio module permanently using a glue, by soldering it to the 5G radio module, or other permanent fastening device or process. In another example embodiment, because the detachable thermal module 356 may be removed to access the 5G radio module, a semipermanent coupling device may be used. This semipermanent coupling device may include a clamp, clip, or other fastening device that allows the first heat conductive element 360 of the detachable thermal module 356 to be removed from the 5G radio module in order to access the 5G radio module for repairs or replacement. In an embodiment, the semipermanent coupling device may include a screw that is passed through a fastener hole formed in the first heat conductive element. This screw or a number of screws may secure the first heat conductive element to a rail 388 or a number of rails. The rails may also be provided near the second heat conductive element 358 so that the second heat conductive element 358 may also be secured to the chassis of the information handling system 300.

In an example embodiment, the first heat conductive element 360 may include EMI shielding 366. The EMI shielding 366 prevents EMI from affecting the operations of the 5G radio module from other components within the chassis 310 of the information handling system 300 or from 5G radio module from affecting other components in the chassis 310. The EMI shielding 366 may reduce the coupling of radio waves, electromagnetic fields, and electrostatic fields at the 5G radio module coupled under the first heat conductive element 360. In an embodiment, the EMI shielding 366 may be operatively coupled to a grounding source within the chassis 310 of the information handling system 300 in order to provide effective shielding of the 5G radio module.

The first heat conductive element 360 may be operatively coupled to a detachable thermal module heat pipe 362. The first heat conductive element 360 may be operatively coupled to the detachable thermal module heat pipe 362 using, for example, a glue, via soldering, or other coupling mechanism or process in order to secure the first heat conductive element 360 to the detachable thermal module heat pipe 362 such that the heat at the first heat conductive element 360 may also be diffused into the detachable thermal module heat pipe 362. The detachable thermal module heat pipe 362 may be any type of heat pipe that allows for the heat at the first heat conductive element 360 to diffuse into the detachable thermal module heat pipe 362 and to a second heat conductive element 358 in an embodiment. The detachable thermal module heat pipe 362 may be one of a vapor chamber, a variable conductance heat pipe (VCHP), a pressure-controlled heat pipe (PCHP), a diode heat pipe, among others in other embodiments. In an example embodiment, the detachable thermal module heat pipe 362 may be a vapor chamber that includes a hermetically sealed hollow vessel with a working fluid within the hollow. As the working fluid is heated at or around the first heat conductive element 360, the working fluid may be vaporized and allowed to flow to a condensing surface such as those surfaces within the detachable thermal module heat pipe 362 close to the second heat conductive element 358. In an embodiment described herein, the relative temperatures at the end of the detachable thermal module heat pipe 362 near the first heat conductive element 360 and the end of the detachable thermal module heat pipe 362 near the second heat conductive element 358 may allow for the vaporized working fluid to condense at or near the second heat conductive element 358 thereby transferring heat from the first heat conductive element 360 to the second heat conductive element 358.

The second heat conductive element 358 may be similar in form to the first heat conductive element 360. In an embodiment, the second heat conductive element 358 may be formed into a sheet and, in an example embodiment, be made of metal or other heat conductive material. The metal may be a heat conductive and heat diffusing metal that receives heat from the second heat conductive element 358 and diffuses the heat into the cooling system heat pipe 354 which is configured to cool one or more processors (e.g., CPU or GPU) at location 302 of the processor. In an example embodiment, the second heat conductive element 358 may be made of aluminum or copper or other heat conductive metal. In an embodiment, the second heat conductive element 358 may include a thermal pad similar to the thermal pad affixed to the first heat conductive element 360. The thermal pad of the second heat conductive element 358 may also aid in the conduction of heat away from the detachable thermal module heat pipe 362 and into the cooling system heat pipe 354.

In an embodiment, the second heat conductive element 358 is operatively coupled to the cooling system heat pipe 354 permanently using a glue or other permanent fastening device. In another example embodiment, because the detachable thermal module 356 may be removed to access the 5G radio module or other components within the chassis of the information handling system 300, a semipermanent coupling device may be used to secure the second heat conductive element 358 to the cooling system heat pipe 354. This semipermanent coupling device may include a clamp, clip, or other fastening device that allows the second heat conductive element 358 of the detachable thermal module 356 to be removed from the cooling system heat pipe 354 in order to access the 5G radio module and other components for repairs or replacement of the devices within the chassis of the information handling system 300.

As described herein, the cooling system of the information handling system may be an active cooling system and may include a fan 352 that is operatively coupled to the cooling system heat pipe 354. Heat generated at the processing device at location 302 may be diffused through the cooling system heat pipe 354 to the fan 352. In the embodiment shown in FIG. 3, the fan 352 may draw air into the chassis of the fan 352 from a bottom side of the fan 352 and expel that air out of the fan 352 along a sidewall of the chassis of the information handling system 300 through a vent 364. In an embodiment, a D-cover (e.g., a bottom half of a base chassis 310 of the information handling system 300) may include an intake vent that allows air to pass into the bottom side of the fan 352. Although FIG. 3 shows a single vent 364, the present specification contemplates that multiple vents may be present that allows air to be passed over additional portions of the cooling system heat pipe 354 and out of the chassis 310 of the information handling system 300 using multiple output ports formed in the fan 352. For example, an additional vent may be formed on a back sidewall of the information handling system for air to be passed from the fan 352 and out of the chassis of the information handling system 300.

The cooling system may also include, in an example embodiment, an array of metallic fins that are operatively coupled to the cooling system heat pipe 354 for example at vent 364. The array of fins may absorb heat from the cooling system heat pipe 354. As that air passes over the array of fins and the cooling system heat pipe 354 it may passively cool the heat diffused from the processing device at location 302 and at the 5G radio module placed under the first heat conductive element 360 through the cooling system heat pipe 354 and across the fins and out through vent 364 formed in the chassis of the information handling system 300. Such a cooling system may be a passive cooling system in some embodiments.

In other embodiments, the detachable thermal module 356 may similarly diffuse heat produced at the 5G radio module through the first heat conductive element 360, the detachable thermal module heat pipe 362, and the second heat conductive element 358 and into the cooling system heat pipe 354 that the second heat conductive element 358 is operatively coupled to. The heat diffused from the second heat conductive element 358 and into the cooling system heat pipe 354 may also be passed into the array of fins and the air current passed over the second heat conductive element 358, array of fins, and cooling system heat pipe 354 by the fan 352 to actively cool the processor 310 and 5G radio module placed under the first heat conductive element 360. Hot air from these components may similarly be passed out of the vent 364 formed into the chassis 310 of the information handling system 300. The detachable thermal module 356, therefore, uses the cooling system already present in the information handling system 300 used to cool the processing device (e.g., CPU, GPU, processor 102, FIG. 1). The detachable thermal module 356 ties the 5G radio module 332 to the cooling system of the processor together in order to take advantage of the cooling system's capacity to cool the 5G radio module in addition to one or more processors. The chance of all three components (e.g., the processor such as a CPU or GPU and the 5G radio module) coincidently running at maximum power is low thereby allowing for the thermal coupling of the detachable thermal module 356 to the cooling system heat pipe 354. Additionally, the costs associated with manufacturing the detachable thermal module 356 may be relatively low, thus, reducing the costs that would otherwise be needed to create a separate cooling system for the 5G radio module.

Figure 4:
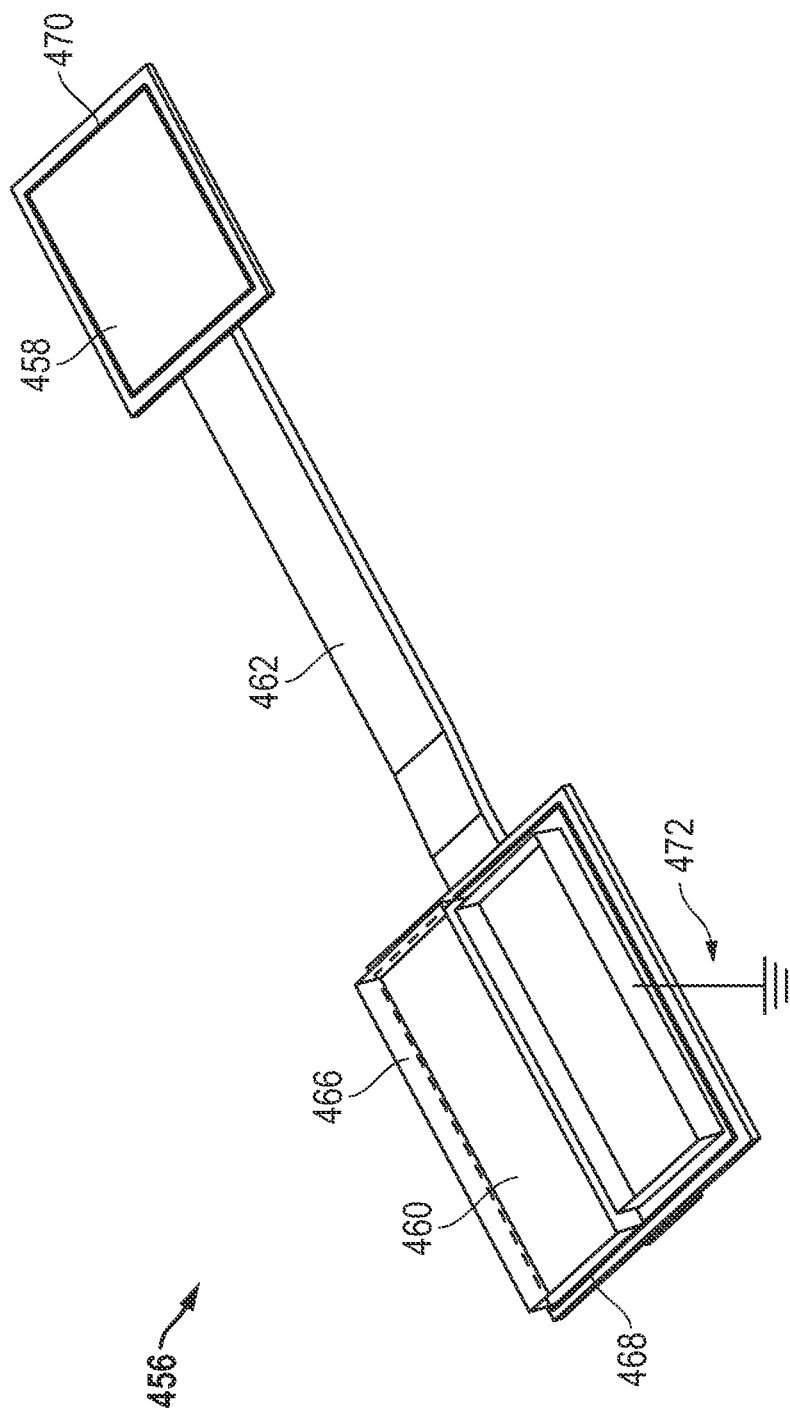
FIG. 4 is a graphic diagram of a bottom view of a detachable thermal module according to another embodiment of the present disclosure.

FIG. 4 is a graphic diagram of a bottom view of a detachable thermal module 456 according to another embodiment of the present disclosure. FIG. 4 shows an underside of the detachable thermal module heat pipe 462. In an embodiment, the surface shown on the first heat conductive element 460 contacts that 5G radio module. The first heat conductive element 460 may be formed into a sheet and, in an example embodiment, be made of metal or other heat conductive material. The metal may be a heat conductive and heat diffusing metal that receives heat from a 5G radio module and diffuses the heat into a detachable thermal module heat pipe 462. In an example embodiment, the first heat conductive element 460 may be made of aluminum or copper or other heat conductive metal.

In an embodiment, the first heat conductive element 460 is operatively coupled to the 5G radio module permanently using a glue or other permanent fastening device. In another example embodiment, because the detachable thermal module 456 may be removed to access the 5G radio module, a semipermanent coupling device may be used. This semipermanent coupling device may include a clamp, clip, or other fastening device that allows the first heat conductive element 460 of the detachable thermal module 456 to be removed from the 5G radio module in order to access the 5G radio module for repairs or replacement.

In an example embodiment, the first heat conductive element 460 may include electromagnetic interference (EMI) shielding 466. The EMI shielding 466 prevents EMI from affecting the operations of the 5G radio module or other components within the chassis of the information handling system. The EMI shielding 466 may reduce the coupling of radio waves, electromagnetic fields, and electrostatic fields at the 5G radio module operatively coupled to the first heat conductive element 460. In an embodiment, the EMI shielding 466 may be operatively coupled to a grounding source within the chassis of the information handling system in order to provide effective shielding of the 5G radio module. In an embodiment, the EMI shielding 466 may also include a grounding source 472. In the embodiment shown in FIG. 4, the grounding source 472 of the EMI shielding 466 may be operatively coupled to a grounding location within the chassis of the information handling system in order to provide effective shielding of the 5G radio module. The grounding location within the information handling system may be a portion of the metal chassis in an example embodiment.

In an embodiment, the first heat conductive element 460 may include a first thermal pad 468 (also called a thermally conductive pad) that aids in the conduction of heat away from the 5G radio module and into the first heat conductive element 460. This first thermal pad 468 may be sandwiched in between the first heat conductive element 460 and the 5G radio module when the detachable thermal module is installed as described herein.

The first heat conductive element 460 may be operatively coupled to a detachable thermal module heat pipe 462. The first heat conductive element 460 may be operatively coupled to the detachable thermal module heat pipe 462 using, for example, a glue, via soldering, or other coupling mechanism or process in order to secure the first heat conductive element 460 to the detachable thermal module heat pipe 462 such that the heat at the first heat conductive element 460 may also be diffused into the detachable thermal module heat pipe 462. The detachable thermal module heat pipe 462 may be any type of heat pipe that allows for the heat at the first heat conductive element 460 to diffuse into the detachable thermal module heat pipe 462 and to a second heat conductive element 458. As described, the detachable thermal module heat pipe 462 may be one of a vapor chamber, a variable conductance heat pipe (VCHP), a pressure-controlled heat pipe (PCHP), a diode heat pipe, among others. In an example embodiment, the detachable thermal module heat pipe 462 may be a vapor chamber that includes a sealed hollow vessel with a working fluid within the hollow. As the working fluid is heated at or around the first heat conductive element 460, the working fluid may be vaporized and allowed to flow to a condensing surface such as those surfaces within the detachable thermal module heat pipe 462 close to the second heat conductive element 458. In an embodiment described herein, the relative temperatures at the end of the detachable thermal module heat pipe 462 near the first heat conductive element 460 and the end of the detachable thermal module heat pipe 462 near the second heat conductive element 458 may allow for the vaporized working fluid to condense at or near the second heat conductive element 458 thereby transferring heat from the first heat conductive element 460 to the second heat conductive element 458.

The second heat conductive element 458 may be similar in form to the first heat conductive element 460. In an embodiment, the second heat conductive element 458 may be formed into a sheet and, in an example embodiment, be made of metal. The metal may be a heat conductive and heat diffusing metal that receives heat from the second heat conductive element 458 and diffuses the heat into the cooling system heat pipe. In an example embodiment, the second heat conductive element 458 may be made of aluminum or copper or other heat conductive metal. In an embodiment, the second heat conductive element 458 may include a second thermal pad 470 similar to the first thermal pad 468 affixed to the first heat conductive element 460. The second thermal pad 470 of the second heat conductive element 458 may also aid in the conduction of heat away from the detachable thermal module heat pipe 462 and into the cooling system heat pipe.

Figure 5:
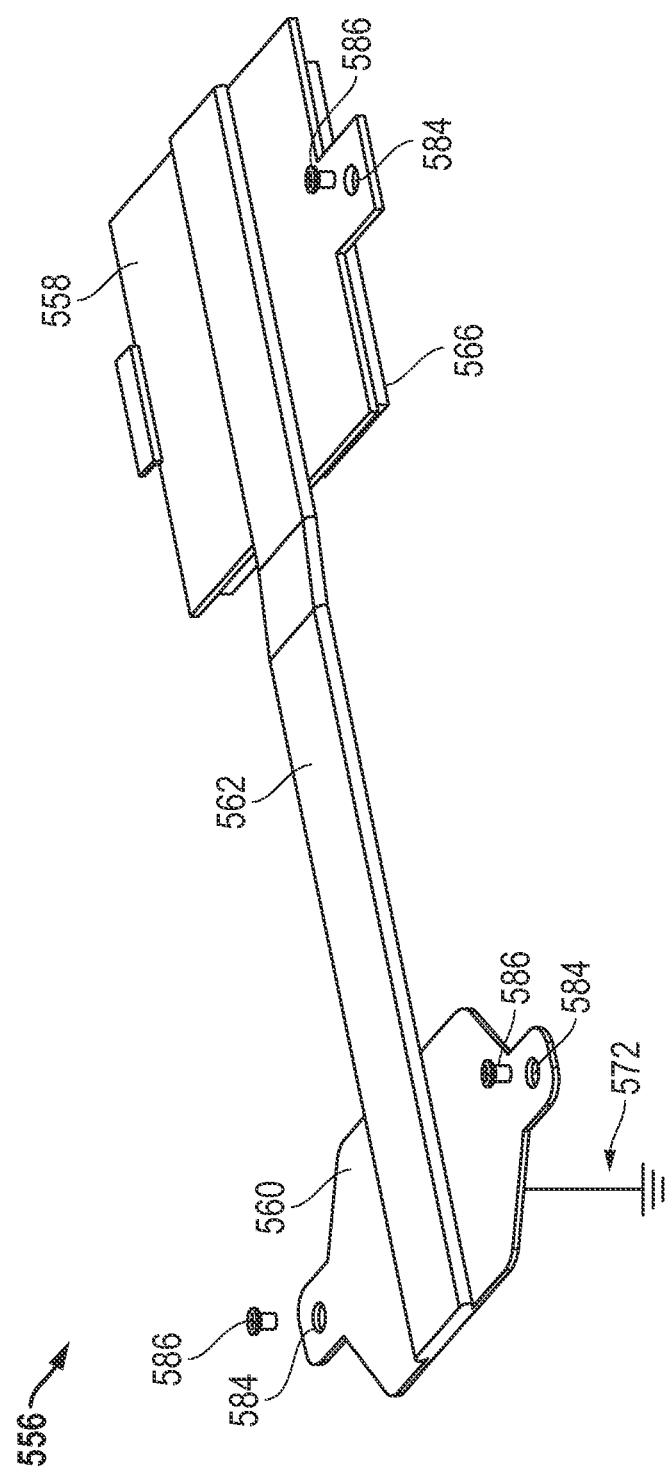
FIG. 5 is a graphic diagram of a top view of a detachable thermal module according to another embodiment of the present disclosure.

FIG. 5 is a graphic diagram of a top view of a detachable thermal module 656 according to another embodiment of the present disclosure. FIG. 5 shows a top side of the detachable thermal module heat pipe 562. In an embodiment, the surface shown on the first heat conductive element 560 is opposite a surface of the first heat conductive element 560 that contacts the heat producing element within the information handling system such as the 5G radio module. The first heat conductive element 560 may be formed into a sheet and, in an example embodiment, be made of metal or other heat conductive material. The metal may be a heat conductive and heat diffusing metal that receives heat from a 5G radio module and diffuses the heat into a detachable thermal module heat pipe 562. In an example embodiment, the first heat conductive element 560 may be made of aluminum or copper or other heat conductive metal.

In an embodiment, the first heat conductive element 560 is operatively coupled to the 5G radio module permanently using a glue or other permanent fastening device. In another example embodiment, because the detachable thermal module 556 may be removed to access the 5G radio module, a semipermanent coupling device may be used. This semipermanent coupling device may include a clamp, clip, or other fastening device that allows the first heat conductive element 560 of the detachable thermal module 556 to be removed from the 5G radio module in order to access the 5G radio module for repairs or replacement. In the embodiment shown in FIG. 5, the first heat conductive element 560 (and the second heat conductive element 558) may include fastener holes 584 used to pass a fastener such as a screw 556 into and secure the first heat conductive element 560 to the heat producing element within the information handling system (e.g., 5G radio module) or the chassis of the information handling system.

In an example embodiment, the first heat conductive element 560 may include EMI shielding (not shown) similar to the EMI shielding described in FIG. 4. The EMI shielding prevents EMI from affecting the operations of the 5G radio module or other components within the chassis of the information handling system. The EMI shielding may reduce the coupling of radio waves, electromagnetic fields, and electrostatic fields at the 5G radio module operatively coupled to the first heat conductive element 560. In an embodiment, the EMI shielding may be operatively coupled to a grounding source within the chassis of the information handling system in order to provide effective shielding of the 5G radio module. In an embodiment, the EMI shielding may also include a grounding source 572. In the embodiment shown in FIG. 5, the grounding source 572 of the EMI shielding may be operatively coupled to a grounding location within the chassis of the information handling system in order to provide effective shielding of the 5G radio module. The grounding location within the information handling system may be a portion of the metal chassis in an example embodiment such as a rail or other structural device.

In an embodiment, the first heat conductive element 560 may include a first thermal pad (not shown) (also called a thermally conductive pad) that aids in the conduction of heat away from the 5G radio module and into the first heat conductive element 560. This first thermal pad 568 may be sandwiched in between the first heat conductive element 560 and the 5G radio module when the detachable thermal module 560 is installed as described herein.

The first heat conductive element 560 may be operatively coupled to a detachable thermal module heat pipe 562. The first heat conductive element 560 may be operatively coupled to the detachable thermal module heat pipe 562 using, for example, a glue, via soldering, or other coupling mechanism or process in order to secure the first heat conductive element 560 to the detachable thermal module heat pipe 562 such that the heat at the first heat conductive element 560 may also be diffused into the detachable thermal module heat pipe 562. The detachable thermal module heat pipe 562 may be any type of heat pipe that allows for the heat at the first heat conductive element 560 to diffuse into the detachable thermal module heat pipe 562 and to a second heat conductive element 558. As described, the detachable thermal module heat pipe 562 may be one of a vapor chamber, a variable conductance heat pipe (VCHP), a pressure-controlled heat pipe (PCHP), a diode heat pipe, among others. In an example embodiment, the detachable thermal module heat pipe 562 may be a vapor chamber that includes a sealed hollow vessel with a working fluid within the hollow. As the working fluid is heated at or around the first heat conductive element 560, the working fluid may be vaporized and allowed to flow to a condensing surface such as those surfaces within the detachable thermal module heat pipe 562 close to the second heat conductive element 558. In an embodiment described herein, the relative temperatures at the end of the detachable thermal module heat pipe 562 near the first heat conductive element 560 and the end of the detachable thermal module heat pipe 562 near the second heat conductive element 558 may allow for the vaporized working fluid to condense at or near the second heat conductive element 558 thereby transferring heat from the first heat conductive element 560 to the second heat conductive element 558.

The second heat conductive element 558 may be similar in form to the first heat conductive element 560. In an embodiment, the second heat conductive element 558 may be formed into a sheet and, in an example embodiment, be made of metal. The metal may be a heat conductive and heat diffusing metal that receives heat from the second heat conductive element 558 and diffuses the heat into the cooling system heat pipe. In an example embodiment, the second heat conductive element 558 may be made of aluminum or copper or other heat conductive metal. In an embodiment, the second heat conductive element 558 may include a second thermal pad 570 similar to the first thermal pad 568 affixed to the first heat conductive element 560. The second thermal pad 570 of the second heat conductive element 558 may also aid in the conduction of heat away from the detachable thermal module heat pipe 562 and into the cooling system heat pipe. As described, the second heat conductive element 558 may include fastener holes 584 used to pass a fastener such as a screw 556 into and secure the second heat conductive element 558 to the cooling system heat pipe that is also operatively coupled to, in an embodiment, the processing device of the information handling system.

Figure 6:
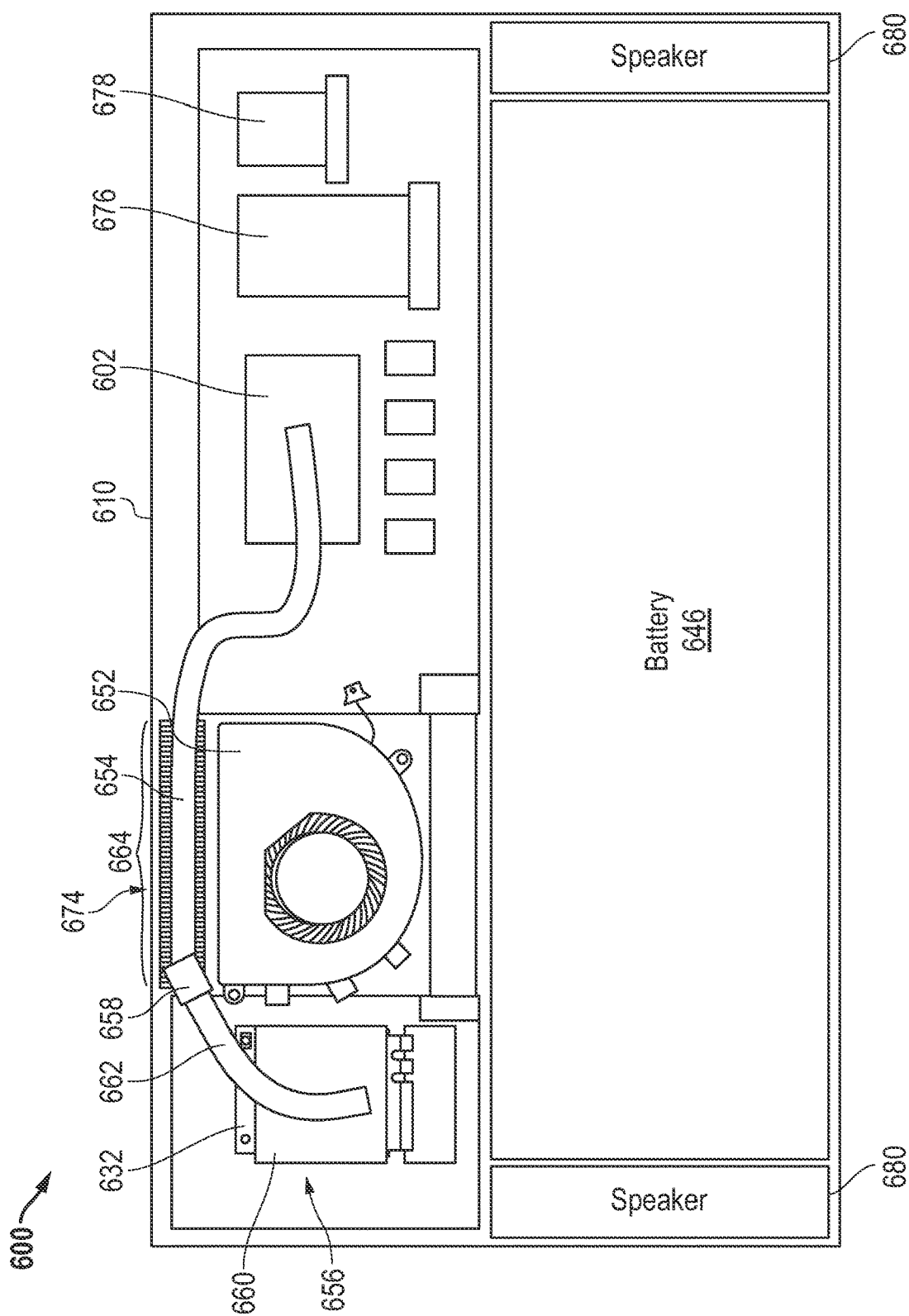
FIG. 6 is a graphic block diagram of a detachable thermal module placed in thermal communication with a 5G radio module and a cooling system within the information handling system according to an embodiment of the present disclosure.

FIG. 6 is a graphic block diagram of a detachable thermal module 556 placed in thermal communication with a 5G radio module 632 and an existing cooling system within the information handling system 600 according to an embodiment of the present disclosure. FIG. 6 shows an example layout of the fan 652, cooling system heat pipe 654, detachable thermal module 656 with a second heat conductive element 658, first heat conductive element 660, and detachable thermal module heat pipe 662 relative to each other. The present specification contemplates other layouts of these components within a chassis of the information handling system 600. As shown in the embodiment of FIG. 6, the fan 652 may be placed between the detachable thermal module 656 and the processing device 602. This is different than that embodiment layout shown in FIG. 3 which shows the processor intermediate to the fan and the 5G radio module.

As described herein, the information handling system 600 includes a detachable thermal module 656. In those information handling systems 600 where a 5G radio module 632 is added within the chassis of the information handling system 600, the detachable thermal module 656 may be used to cool the 5G radio module 632 by dissipating the heat from the first heat conductive element 660, though the detachable thermal module heat pipe 662, to the second heat conductive element 658, and into the cooling system heat pipe 654.

The first heat conductive element 660 may be formed into a sheet and, in an example embodiment, be made of metal or other thermally conductive material. The metal may be a heat conductive and heat diffusing metal that receives heat from the 5G radio module 632 and diffuses the heat into a detachable thermal module heat pipe 662. In an example embodiment, the first heat conductive element 660 may be made of aluminum or copper or other heat conductive metal. In an embodiment, the first heat conductive element 660 may include a thermal pad (also called a thermally conductive pad) that aids in the conduction of heat away from the 5G radio module 632 and into the first heat conductive element 660.

In an embodiment, the first heat conductive element 660 is operatively coupled to the 5G radio module 632 permanently using a glue, by soldering it to the 5G radio module 632, or other permanent fastening device or process. In another example embodiment, because the detachable thermal module 656 may be removed to access the 5G radio module 632, a semipermanent coupling device may be used. This semipermanent coupling device may include a clamp, clip, or other fastening device that allows the first heat conductive element 660 of the detachable thermal module 656 to be removed from the 5G radio module 632 in order to access the 5G radio module 632 for repairs or replacement.

In an example embodiment, the first heat conductive element 660 may include EMI shielding. The EMI shielding prevents EMI from affecting the operations of the 5G radio module 632 or other components within the chassis of the information handling system 600. The EMI shielding may reduce the coupling of radio waves, electromagnetic fields, and electrostatic fields to the 5G radio module 632 at the first heat conductive element 660. In an embodiment, the EMI shielding may be operatively coupled to a grounding source within the chassis 610 of the information handling system 600 in order to provide effective shielding of the 5G radio module.

The first heat conductive element 660 may be operatively coupled to a detachable thermal module heat pipe 662. The first heat conductive element 660 may be operatively coupled to the detachable thermal module heat pipe 662 using, for example, a glue, via soldering, or other coupling mechanism or process in order to secure the first heat conductive element 660 to the detachable thermal module heat pipe 662 such that the heat at the first heat conductive element 660 may also be diffused into the detachable thermal module heat pipe 662. The detachable thermal module heat pipe 662 may be any type of heat pipe that allows for the heat at the first heat conductive element 660 to diffuse into the detachable thermal module heat pipe 662 and to a second heat conductive element 658. The detachable thermal module heat pipe 662 may be one of a vapor chamber, a variable conductance heat pipe (VCHP), a pressure-controlled heat pipe (PCHP), a diode heat pipe, a thermosyphon, a rotating heat pipe, among others.

The second heat conductive element 658 may be similar in form to the first heat conductive element 660. In an embodiment, the second heat conductive element 658 may be formed into a sheet and, in an example embodiment, be made of metal. The metal may be a heat conductive and heat diffusing metal that receives heat from the second heat conductive element 658 and diffuses the heat into the cooling system heat pipe 654. In an example embodiment, the second heat conductive element 658 may be made of aluminum or copper or other heat conductive metal. In an embodiment, the second heat conductive element 658 may include a thermal pad similar to the thermal pad affixed to the first heat conductive element 660. The thermal pad of the second heat conductive element 658 may also aid in the conduction of heat away from the detachable thermal module heat pipe 662 and into the cooling system heat pipe 654.

In an embodiment, the second heat conductive element 658 is operatively coupled to the cooling system heat pipe 654 permanently using a glue or other permanent fastening device. In another example embodiment, because the detachable thermal module 656 may be removed to access the 5G radio module 632 or other components within the chassis of the information handling system 600, a semipermanent coupling device may be used to secure the second heat conductive element 658 to the cooling system heat pipe 654. This semipermanent coupling device may include a clamp, clip, or other fastening device that allows the second heat conductive element 658 of the detachable thermal module 656 to be removed from the cooling system heat pipe 654 in order to access the 5G radio module and other components for repairs or replacement of the devices within the chassis of the information handling system 600.

As described herein, the cooling system of the information handling system 600 may include a fan 652 that is operatively coupled to the cooling system heat pipe 654. Heat generated at the processing device 602 (e.g., a CPU or GPU) may be diffused through the cooling system heat pipe 654 to the fan 652. In the embodiment shown in FIG. 6, the fan 652 may draw air into the chassis of the fan 652 from a bottom side of the fan 652 and expel that air out of the fan 652 along vent 664 at a sidewall of the chassis 610 of the information handling system 600. In an embodiment, a D-cover (e.g., a bottom half of a base chassis 610 of the information handling system 600) may include an intake vent that allows air to pass into the bottom side of the fan 652.

The cooling system may also include, in an example embodiment, an array of metallic fins 674 that are operatively coupled to the cooling system heat pipe 654. The array of fins 674 may absorb heat from the cooling system heat pipe 654. Fins 674 may be located at a vent 664 in a sidewall of the information handling system chassis 610. As air is passed over the array of fins 674 and the cooling system heat pipe 654 by operation of the fan 652, the heat diffused from the processing device through the cooling system heat pipe 654 may be blown through a vent 664 formed in the chassis 610 of the information handling system 600.

The detachable thermal module 656 may similarly diffuse heat produced at the 5G radio module 632 through the first heat conductive element 660, the detachable thermal module heat pipe 662, and the second heat conductive element 658 and into the cooling system heat pipe 654 that the second heat conductive element 658 is operatively coupled. The heat diffused from the second heat conductive element 658 and into the cooling system heat pipe 654 may also be passed into the array of fins 674 and the air current passed over the second heat conductive element 658, array of fins 674, and cooling system heat pipe 654 by the fan 652 cools those components. Hot air from these components may similarly be passed out of the vent 664 formed into the chassis 610 of the information handling system 600. The detachable thermal module 656, therefore, uses the cooling system already present in the information handling system 600 used to cool the processing device (e.g., CPU or GPU such as processor 102, FIG. 1). The detachable thermal module 656 ties the relatively lower power 5G radio module 632 to the cooling system of the processor together in order to take advantage of the cooling system's capacity to cool the 5G radio module 632. The chance of all three components (e.g., the CPU, GPU, or processor, the cooling system heat pipe 654, and the 5G radio module 632) coincidently running at maximum power is low thereby allowing for the thermal coupling of the detachable thermal module 656 to the cooling system heat pipe 654. Additionally, the costs associated with manufacturing the detachable thermal module 656 may be relatively low thereby reducing the costs that would otherwise be needed to create a separate cooling system for the 5G radio module 632.

The information handling system 600 shown in FIG. 6 also show additional elements within the chassis of the information handling system 600 that includes a solid-state drive (SSD) 676, a battery 646, and a pair of speakers 680. Again, the arrangement of these elements are merely exemplary, and the present specification contemplates that other arrangements is anticipated. In an embodiment, the information handling system 600 may also include other radio modules such as a WLAN radio module 678. The WLAN radio module 678 may operate at those frequencies that do not produce the levels of heat at the WLAN radio module 678 that the 5G radio module 632 creates. This may be because the level of power used by the WLAN radio module 678 are not as high as those at the 5G radio module 632. In an embodiment, it is appreciated that if the WLAN radio module 678 were to operate a frequency that require the power levels similar to that of the 5G radio module 632, an additional detachable thermal module 656 may be used to cool the WLAN radio module 678 as well.

Figure 7:
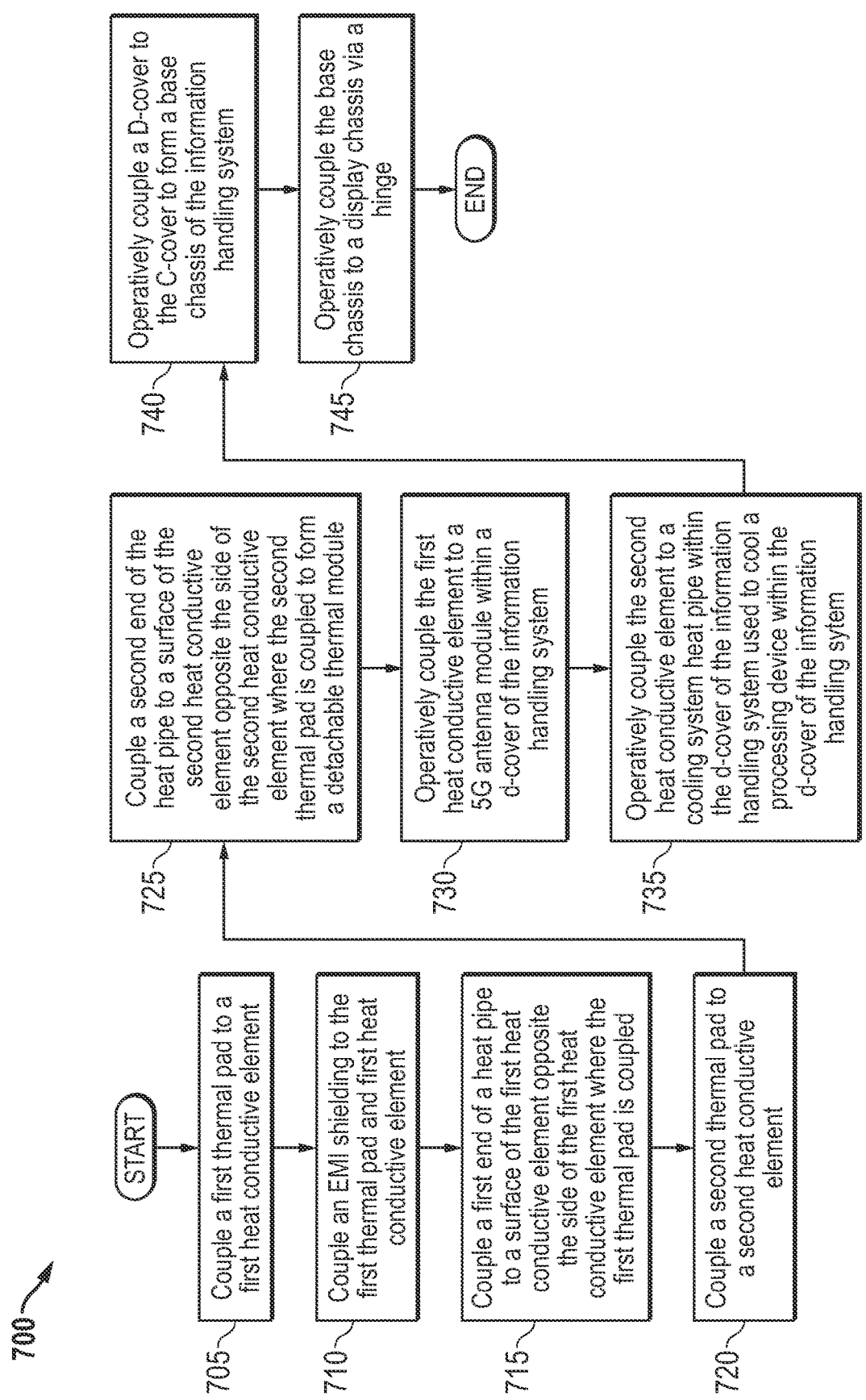
FIG. 7 is a flow diagram illustrating a method of manufacturing an information handling system with a detachable thermal module of an information handling system according to an embodiment of the present disclosure.

FIG. 7 is a flow diagram illustrating a method 700 of manufacturing an information handling system with a detachable thermal module of an information handling system according to an embodiment of the present disclosure. The method 700 may include, at block 705, coupling a first thermal pad to a first heat conductive element. In an embodiment, the first thermal pad may be permanently coupled to a bottom side of the first heat conductive element using any type of coupling device or processes such that the first thermal pad may transmit heat from the first thermal pad to the first heat conductive element. The first heat conductive element may be formed into a sheet and, in an example embodiment, be made of metal. In an example embodiment, the first heat conductive element may be made of aluminum or copper or other heat conductive metal. The first thermal pad may be made of any material that aids in the conduction of heat away from a 5G radio module and into the first heat conductive element. In an embodiment, the first thermal pad may be made of a thermally conductive material such as silicone, silicone elastomer, copper foil or tape, aluminum foil or tape, thermally conductive epoxy or adhesive, paraffin wax, and acrylic among others.

The method 700 further includes coupling an EMI shielding to the first thermal pad and first heat conductive element at block 710. The EMI shielding prevents EMI from affecting the operations of the 5G radio module or other components within the chassis of the information handling system. The EMI shielding may reduce the coupling of radio waves, electromagnetic fields, and electrostatic fields at a 5G radio module under the first heat conductive element. In an embodiment, the EMI shielding may be operatively coupled to a grounding source within the chassis of the information handling system in order to provide effective shielding of the 5G radio module in an example embodiment. The EMI shielding may be operatively coupled by a ground wire or cable to a ground line of a printed circuit board or to a metal chassis of the information handling system. In another embodiment, the EMI shielding may be grounded via a conductive portion of the detachable thermal module and existing cooling structure to the chassis of the information handling system.

At block 715, the method 700 may include coupling a first end of a detachable thermal module heat pipe to a surface of the first heat conductive element that is opposite the side of the first heat conductive element where the first thermal pad is coupled. This opposite side of the first heat conductive element may be referred to herein as a top side of the first heat conductive element. The coupling of the first end of a detachable thermal module heat pipe to the top side of the first heat conductive element may include soldering the first heat conductive element to the first end of the detachable thermal module heat pipe. In this example embodiment, the soldering process may allow heat to transfer between the first heat conductive element and the first end of a detachable thermal module heat pipe.

As described herein, the detachable thermal module heat pipe may be a be a vapor chamber that includes a hermetically sealed hollow vessel with a working fluid within the hollow. As the working fluid is heated at or around the first heat conductive element, the working fluid may be vaporized and allowed to flow to a condensing surface such as those surfaces within the detachable thermal module heat pipe close to a second end of the detachable thermal module heat pipe.

The method 700 may further include, at block 720, with coupling a second thermal pad to a second heat conductive element. Similar to the first heat conductive element and first thermal pad, the second thermal pad may be permanently coupled to a bottom side of the second heat conductive element using any type of coupling device or processes such that the second thermal pad may transmit heat from the second thermal pad to the second heat conductive element. The second heat conductive element may be formed into a sheet and, in an example embodiment, be made of metal. In an example embodiment, the second heat conductive element may be made of aluminum or copper or other heat conductive metal. The second thermal pad may be made of any material that aids in the conduction of heat away from a second end of the detachable thermal module heat pipe and into the second heat conductive element. In an embodiment, the second thermal pad may be made of a thermally conductive material such as silicone, silicone elastomer, copper foil or tape, aluminum foil or tape, thermally conductive epoxy or adhesive, paraffin wax, and acrylic among others.

At block 725, the method 700 may include coupling a second end of the detachable thermal module heat pipe to a surface of the second heat conductive element opposite the side of the second heat conductive element where the second thermal pad is coupled to from the detachable thermal module. Again, the surface of the second heat conductive element opposite the side of the second heat conductive element may be referred to herein as a top side of the second heat conductive element. The method 700 may further include operatively coupling the, now assembled, detachable thermal module into the chassis of the information handling system. As described herein, the assembled detachable thermal module includes the first heat conductive element, the first thermal pad, the second heat conductive element, the second thermal pad, the detachable thermal module heat pipe, and the EMI shielding as described herein.

At block 730 the method 700 includes operatively coupling the first heat conductive element to a 5G radio module that has been placed within a d-cover of the information handling system. In example embodiments described herein, a form factor case of the information handling system may include an "a-cover" which serves as a back cover for a display housing and a "b-cover" which may serve as the bezel, if any, and a display screen of the information handling system such as a laptop information handling system. In a further example, the laptop information handling system case may include a "c-cover" housing a keyboard, touchpad, speaker grill, and any cover in which these components are set and a "d-cover" base housing for the laptop information handling system. Within the c-cover and d-cover housing, the information handling system may include a battery, the cooling system described herein, the processor, one or more memory devices and other components of the information handling system that includes the 5G radio module. It is this d-cover into which the 5G radio module may be secured within the information handling system. The first heat conductive element of the detachable thermal module may be secured to the 5G radio module at block 730.

Additionally, at block 735, the method 700 include operatively coupling the second heat conductive element to a cooling system heat pipe within the d-cover of the information handling system used to cool a processing device within the d-cover of the information handling system. As described herein, the information may include a cooling system used to cool a processor or CPU or GPU during operation of the information handling system. This cooling system includes a heat pipe of its own that is thermally coupled to and dissipates heat from the processing device to fins and a fan in an active cooling system where air is passed over the fins or heat pipe to expel heat from the chassis of the information handling system via a sidewall vent in the d-cover. At block 735, the bottom side of the second heat conductive element of the detachable thermal module is affixed to the heat pipe associated with this processor cooling system.

It is appreciated that the first heat conductive element may be permanently or semi-permanently coupled to the 5G radio module and the second heat conductive element may be permanently or semi-permanently coupled to the heat pipe of the processor cooling system as described herein. In an example embodiment, the first heat conductive element and second heat conductive element may each include a clip or clamp that allows the detachable thermal module to be selectively detached from the 5G radio module and heat pipe of the cooling system in order to access the 5G radio module or other components of the information handling system if and when necessary.

The method 700 further includes, at block 740, operatively coupling a c-cover to the d-cover to form a base chassis of the information handling system. By coupling the c-cover to the d-cover, the base portion of the information handling system has now encased the components of the information handling system such as the 5G radio module, the detachable thermal module, the fan, the processor (e.g., CPU or GPU), data storage devices, other radio modules, a battery, speakers and other devices such as the I/O devices described herein.

At block 745, the method 700 further includes coupling the base chassis to a display chassis via a hinge. As described herein, the information handling system may be a laptop-type information handling system. In this example, embodiment, the laptop-type information handling system may include a base portion with a display portion operatively coupled to the base portion via a hinge mechanism. This may allow a user to view the video display device of the display portion while providing input to the information handling system via, for example, the haptic touchpad described herein. At this point the method 700 may end.

The blocks of the flow diagrams of FIG. 7 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An information handling system with a cooling system, comprising:
    a processor;
    a memory;
    a power management unit (PMU);
    a processor cooling system including:
        a cooling system heat pipe thermally coupled to the processor;
    a detachable thermal module including:
        a first heat conductive element configured to be operatively coupled to a heat producing component including as a processor or a radio module within the information handling system;

a second heat conductive element to be operatively coupled to the cooling system heat pipe of the processor cooling system; and a detachable thermal module heat pipe formed between the first heat conductive element and the second heat conductive element to transfer heat to the processor cooling system.

2. The information handling system of claim 1 further comprising:

the first heat conductive element including a thermal pad placed between the first heat conductive element and the heat producing component within the information handling system when installed.

3. The information handling system of claim 1 further comprising:

the second heat conductive element including a thermal pad placed between the second heat conductive element and the heat pipe of the cooling system when installed.

4. The information handling system of claim 1, wherein detachable thermal module heat pipe formed between the first conductive element and the second heat conductive element is a vapor chamber made of a metal.

5. The information handling system of claim 1 further comprising:

the heat producing component within the information handling system is a radio module; and an electromagnetic interference (EMI) shielding formed onto the first heat conductive element and around the radio module.

6. The information handling system of claim 5, wherein the EMI shielding is grounded to a grounding source.

7. The information handling system of claim 1 further comprising a cooling system heat pipe coupling device to operatively couple the second heat conductive element to the cooling system heat pipe.

8. The information handling system of claim 1 further comprising:

the processor cooling system including a fan to blow air across the processor cooling system heat pipe.

9. A cooling system of an information handling system, comprising:

a processor cooling system operatively coupled to a processing device of the information handling system including:

a processor cooling system heat pipe operatively coupled to a set of radiating fins wherein the radiating fins are coupled to the processor cooling system heat pipe; and a detachable thermal module including:

a first heat conductive element configured to be operatively coupled to a radio module;

a second heat conductive element to be selectively coupled to the processor cooling system heat pipe; and a detachable thermal module heat pipe formed between the first heat conductive element and the second heat conductive element.

10. The cooling system of claim 9 further comprising:

the first heat conductive element including a thermal pad placed between the first heat conductive element and the radio module when installed.

11. The cooling system of claim 9 further comprising:

the second heat conductive element including a thermal pad placed between the second heat conductive element and the heat pipe of the processor cooling system when installed.

12. The cooling system of claim 11, wherein detachable thermal module heat pipe formed between the first conductive element and the second heat conductive element is a vapor chamber.

13. The cooling system of claim 9 further comprising:

an electromagnetic interference (EMI) shielding formed onto the first heat conductive element and to shield the radio module.

14. The cooling system of claim 13, wherein the EMI shielding is grounded to a chassis of the information handling system.

15. The cooling system of claim 9 further comprising:

a processor cooling system heat pipe coupling device to operatively couple the second heat conductive element to the processor cooling system heat pipe.

16. The cooling system of claim 9 further comprising:

the processor cooling system including a fan to blow air across the processor cooling system heat pipe.

17. A detachable thermal module of an information handling system comprising:

a first heat conductive element configured to be thermally coupled to a 5G radio module;

a second heat conductive element to be thermally coupled to a processor cooling system heat pipe of a processor cooling system, wherein the processor is a central processing unit (CPU);

a detachable thermal module heat pipe formed between the first heat conductive element and the second heat conductive element; and an electromagnetic interference (EMI) shielding formed onto the first heat conductive element and configured to be installed around the 5G radio module.

18. The detachable thermal module of claim 17 further comprising:

the first heat conductive element including a thermal pad placed between the first heat conductive element and the radio module when installed.

19. The detachable thermal module of claim 17 further comprising:

the second heat conductive element including a thermal pad placed between the second heat conductive element and the heat pipe of the processor cooling system when installed.

20. The detachable thermal module of claim 17, wherein detachable thermal module heat pipe formed between the first conductive element and the second heat conductive element is a vapor chamber.

* * * * *